United States Patent
Shih et al.

(10) Patent No.: US 11,569,228 B2
(45) Date of Patent: Jan. 31, 2023

(54) SEMICONDUCTOR STRUCTURE AND METHOD OF MANUFACTURING THE SAME

(71) Applicant: NANYA TECHNOLOGY CORPORATION, New Taipei (TW)

(72) Inventors: Chiang-Lin Shih, New Taipei (TW); Hsueh-Han Lu, New Taipei (TW); Yu-Ting Lin, New Taipei (TW); Tsang-Po Yang, New Taipei (TW)

(73) Assignee: NANYA TECHNOLOGY CORPORATION, New Taipei (TW)

( * ) Notice: Subject to any disclaimer, the term of this patent is extended or adjusted under 35 U.S.C. 154(b) by 42 days.

(21) Appl. No.: 17/336,292

(22) Filed: Jun. 1, 2021

(65) Prior Publication Data
US 2022/0384428 A1   Dec. 1, 2022

(51) Int. Cl.
| | |
|---|---|
| *H01L 27/088* | (2006.01) |
| *G01R 31/26* | (2020.01) |
| *H01L 27/108* | (2006.01) |
| *H01L 29/78* | (2006.01) |

(52) U.S. Cl.
CPC ........ *H01L 27/088* (2013.01); *G01R 31/2621* (2013.01); *H01L 27/1085* (2013.01); *H01L 27/10805* (2013.01); *H01L 29/7813* (2013.01)

(58) Field of Classification Search
None
See application file for complete search history.

(56) References Cited

U.S. PATENT DOCUMENTS

| | | | |
|---|---|---|---|
| 2018/0226303 A1* | 8/2018 | Won | ........................ H01L 22/12 |
| 2020/0161455 A1* | 5/2020 | Singh | ................... H01L 29/0692 |
| 2021/0159113 A1 | 5/2021 | Choi et al. | |

* cited by examiner

*Primary Examiner* — Nicholas J Tobergte
*Assistant Examiner* — Kevin Quinto
(74) *Attorney, Agent, or Firm* — CKC & Partners Co., LLC

(57) ABSTRACT

A semiconductor structure and a method of manufacturing a semiconductor structure are provided. The method includes forming a conductive layer on a precursor memory structure, in which the precursor memory structure includes a plurality of transistors and a plurality of contact plugs disposed on and connected to the transistors. The conductive layer in a TEG region is then patterned to form a first patterned conductive layer on the precursor memory structure. The first patterned conductive layer is then patterned to form a plurality of first landing pads extending along a first direction, in which the first landing pads are separated from each other in a second direction that is different from the first direction and are electrically connected to each other through the contact plugs and the transistors.

19 Claims, 16 Drawing Sheets

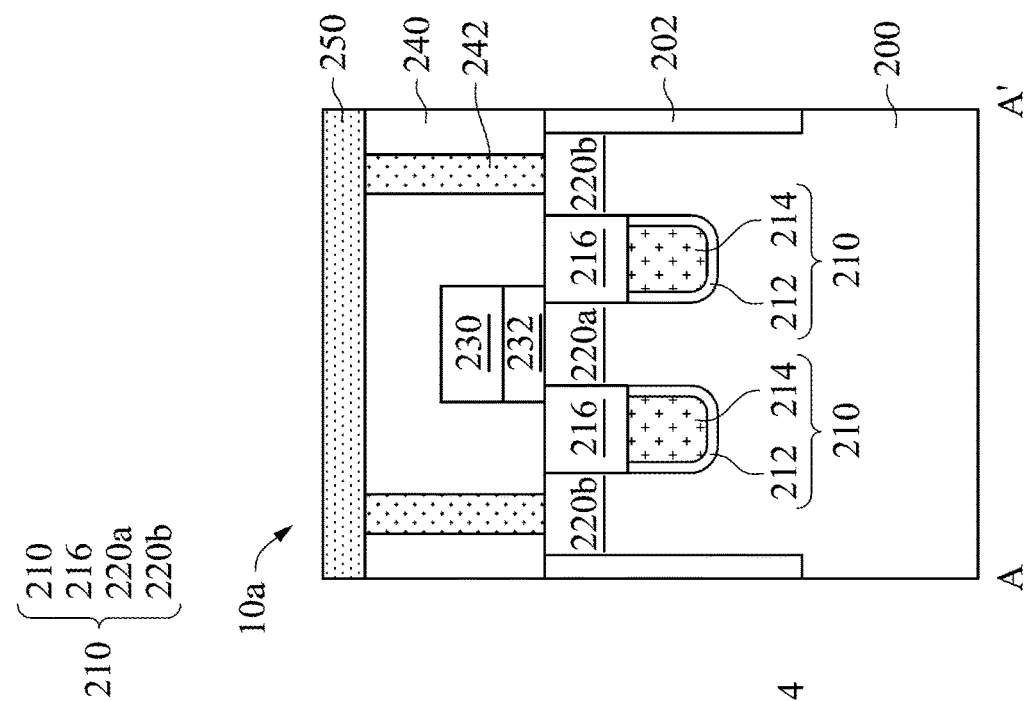
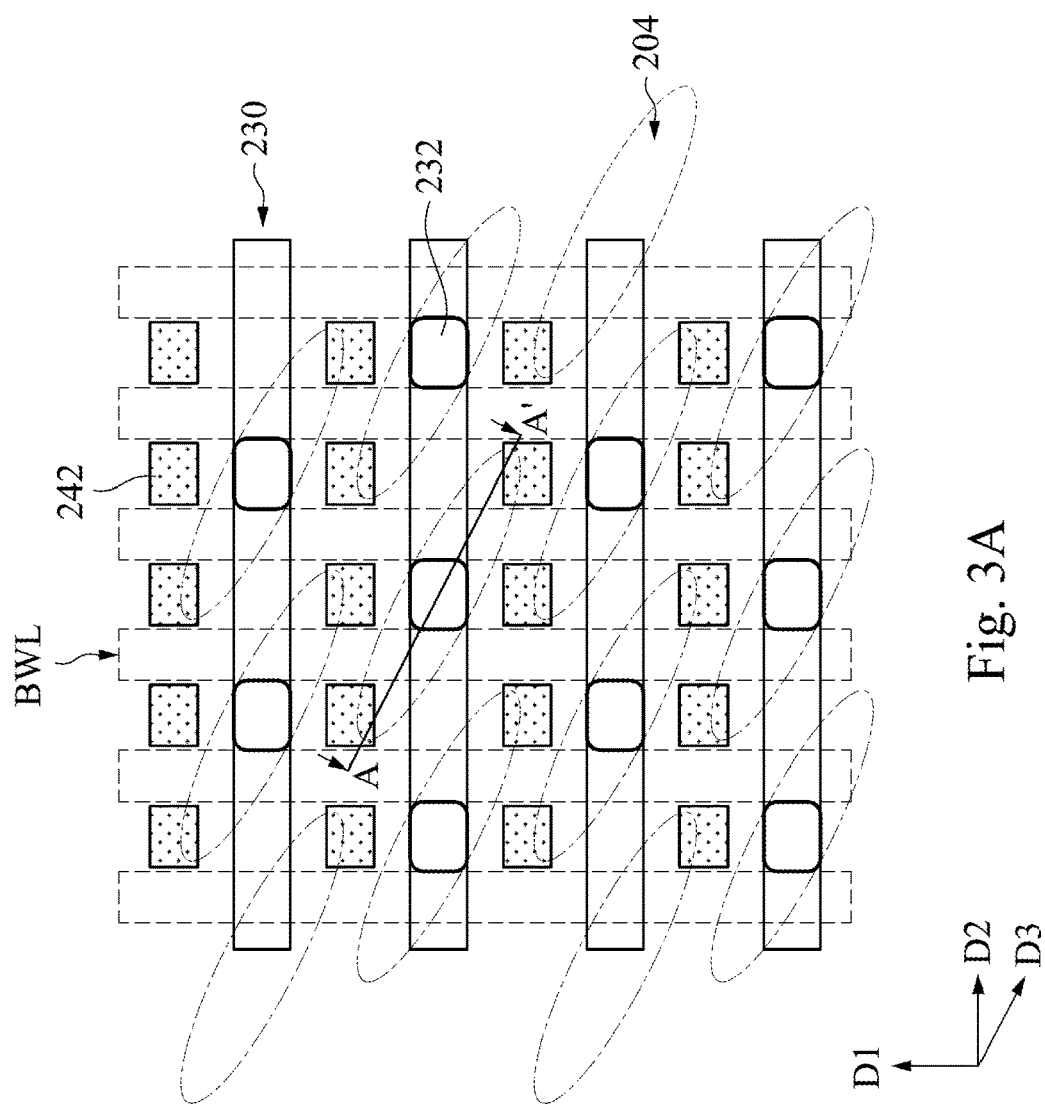
Fig. 3B
Fig. 3A

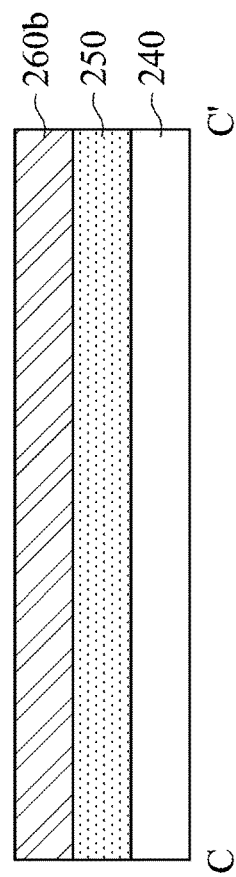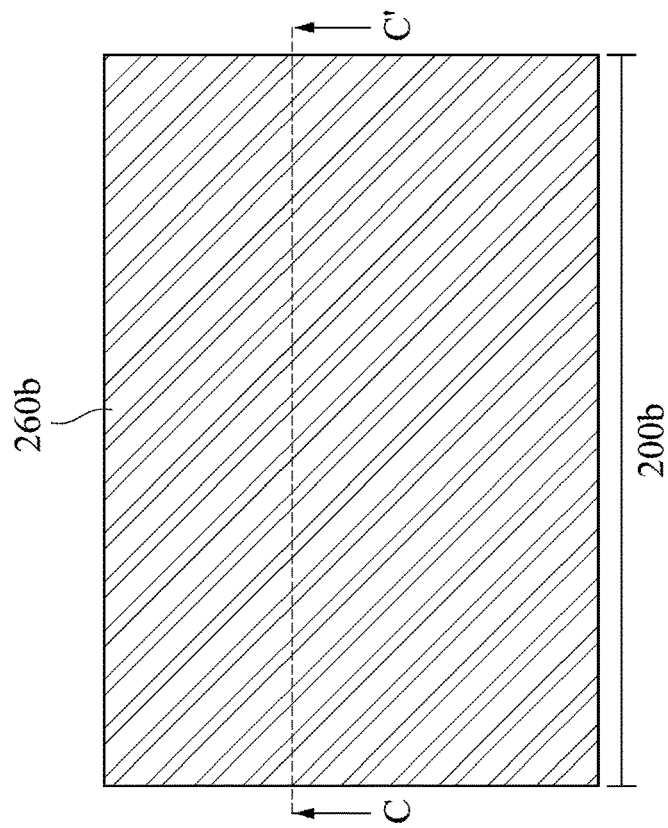
Fig. 6B
Fig. 6A

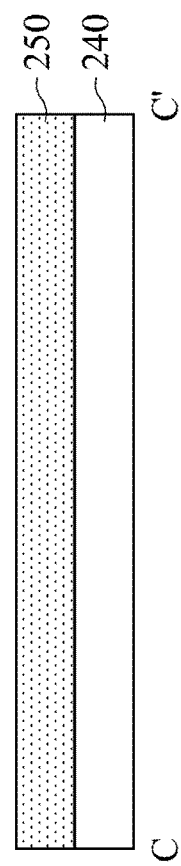
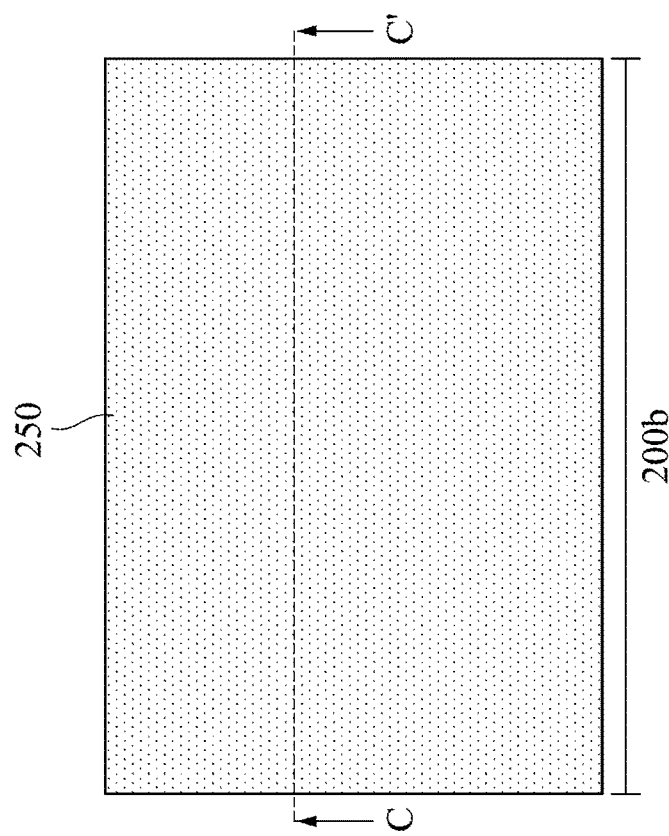
Fig. 7B
Fig. 7A

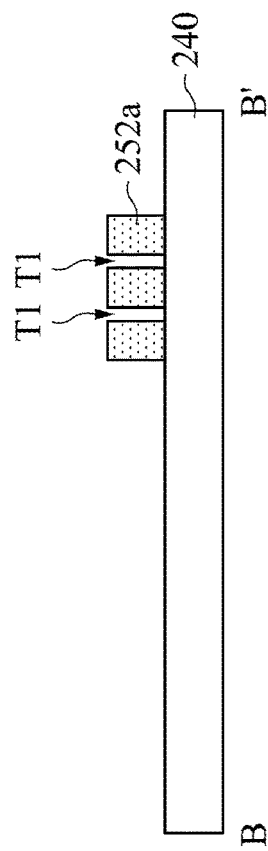
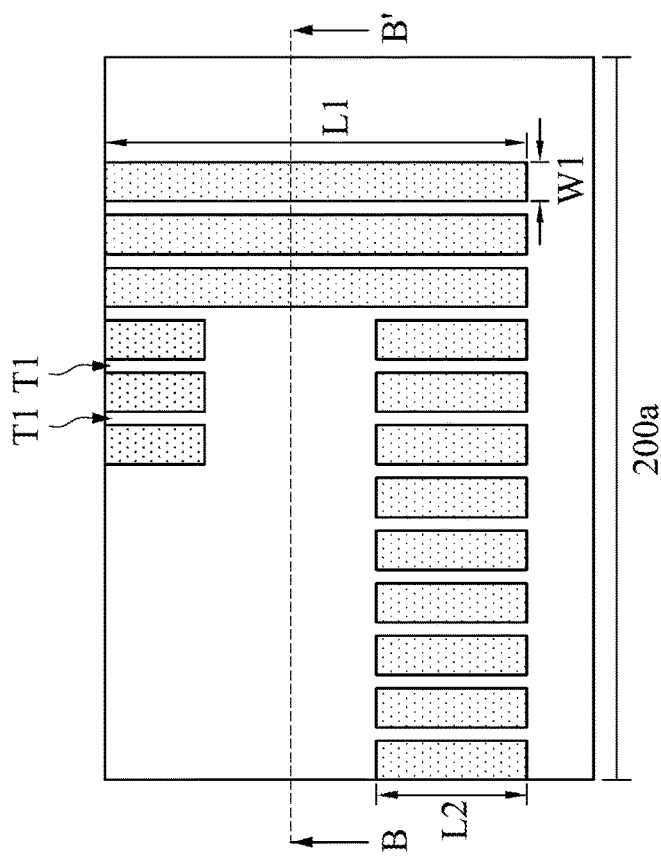
Fig. 8B
Fig. 8A

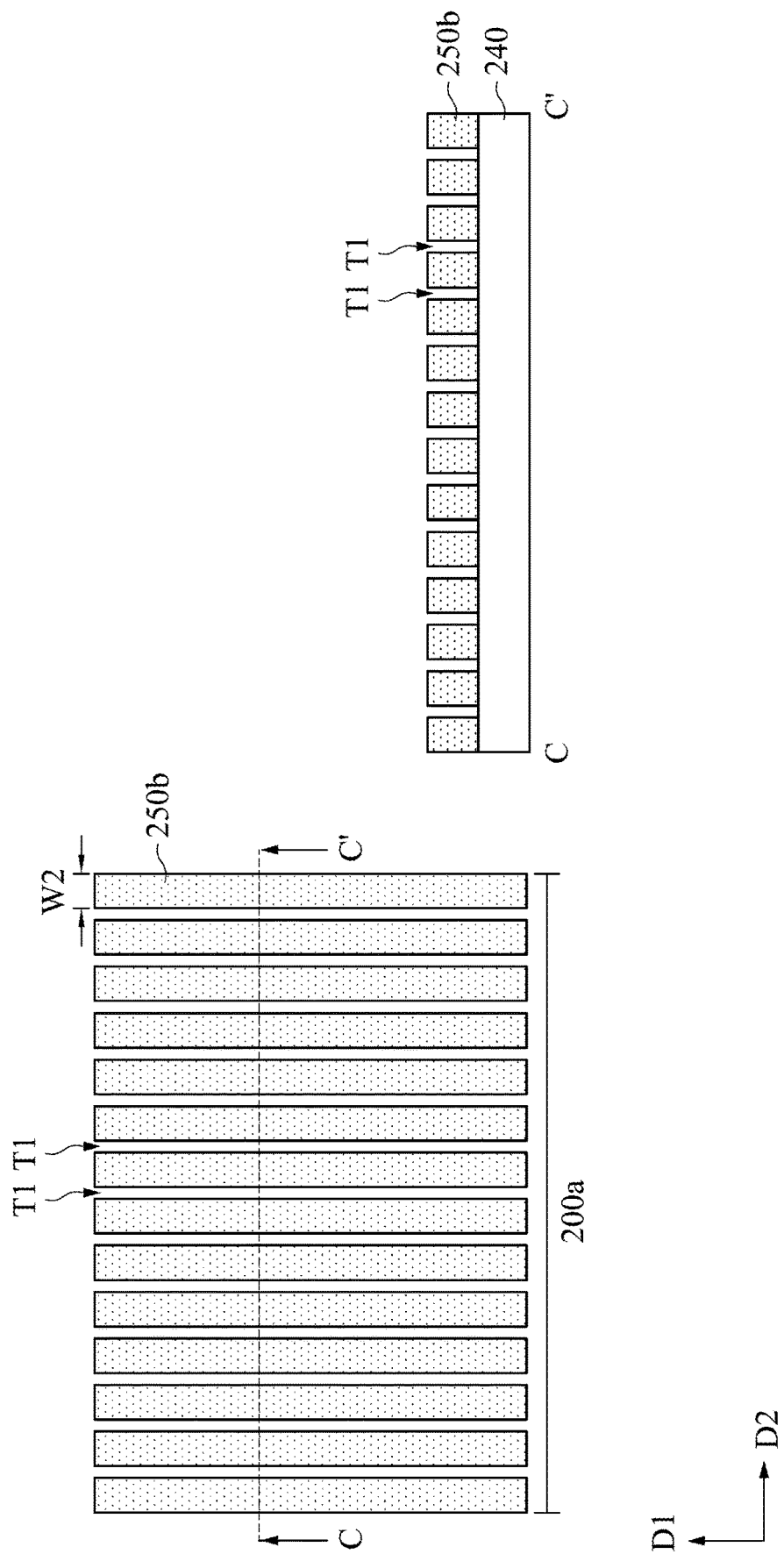

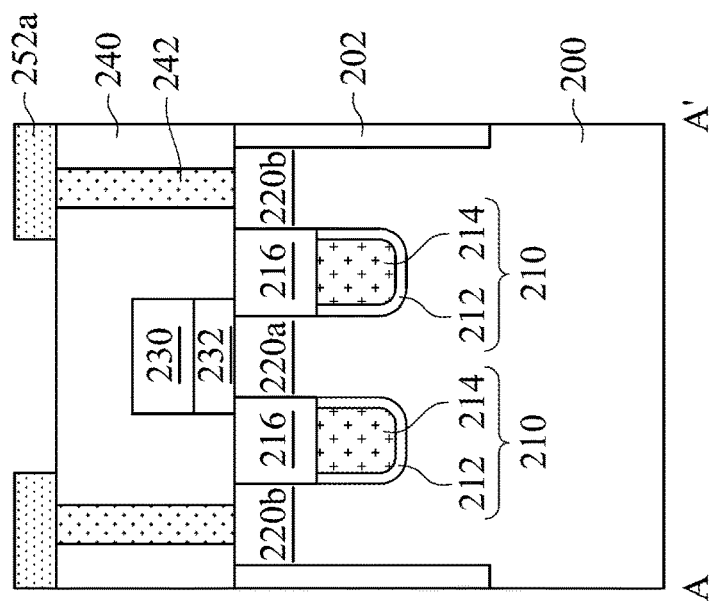
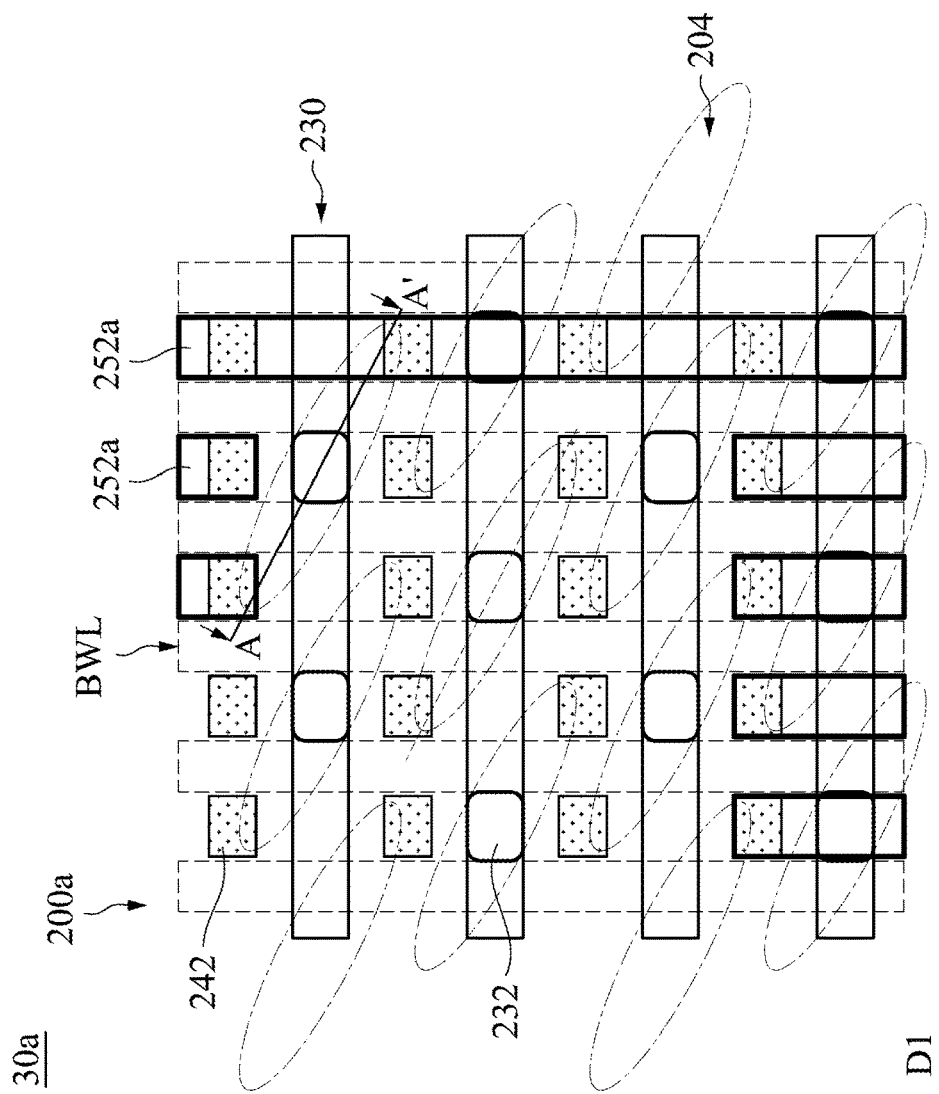
Fig. 12B
Fig. 12A

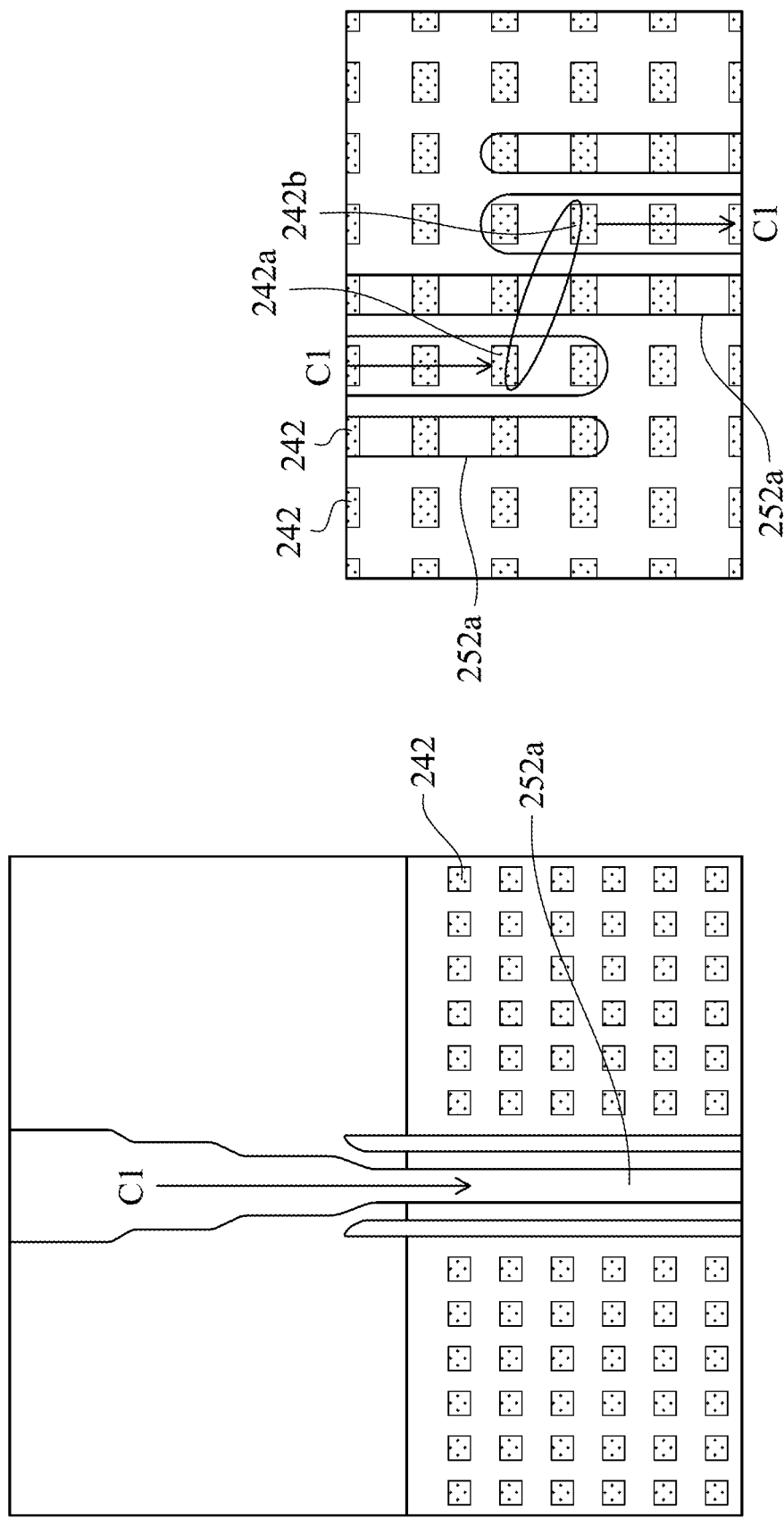

SEMICONDUCTOR STRUCTURE AND METHOD OF MANUFACTURING THE SAME

BACKGROUND

Field of Invention

The present invention relates to a semiconductor structure and method of manufacturing the same. More particularly, the present invention relates to a semiconductor structure for testing a dynamic random access memory (DRAM).

Description of Related Art

With the advancement of semiconductor techniques, the size of semiconductor memory devices has become smaller and smaller, which has led to an increase in the integration of semiconductor memory devices, thereby integrating more functional devices on the same chip. In this case, the line width in the semiconductor memory devices is also gradually reduced, so that the electronic product may be lightweight and compact. However, as the line width in devices gets smaller, semiconductor process techniques will face many challenges.

To assess electric properties of elements constituting a semiconductor memory device in the chips 1, test elements (so-called test element group (TEG) 2) is formed on a scribe line area SL of a semiconductor wafer WF, as shown in FIGS. 1A and 1B. The TEG 2 is electrically tested for determining whether elements are suitably formed in semiconductor memory devices formed on the wafer WF.

Since the TEG 2 is formed using the same process as a process for forming elements in semiconductor memory devices, testing electric properties of the TEG 2 is identical to testing electric properties of the elements formed in the semiconductor memory devices. Accordingly, the properties of the semiconductor memory devices can be correctly deduced by testing the TEG 2. The TEG 2 can be formed in a sacrificial area of the wafer WF. Once the properties have been tested, the TEG 2 can be cut along a scribe line. Hence, the TEG is disposed in a scribe line area SL of the wafer WF to prevent a decrease in the number of semiconductor memory devices that otherwise could be produced from the wafer.

SUMMARY

In accordance with an aspect of the present disclosure, a method of manufacturing a semiconductor structure is provided. A conductive layer is formed on a precursor memory structure, in which the precursor memory structure includes a plurality of transistors and a plurality of contact plugs disposed on and connected to the transistors. The conductive layer in a Test group region is then patterned to form a first patterned conductive layer on the precursor memory structure. The first patterned conductive layer is then patterned to form a plurality of first landing pads extending along a first direction, in which the first landing pads are separated from each other in a second direction that is different from the first direction and are electrically connected to each other through the contact plugs and the transistors.

According to some embodiments of the present disclosure, the precursor memory structure includes an array region adjacent to the test element group region.

According to some embodiments of the present disclosure, the conductive layer in the array region is protected by a mask layer when patterning the conductive layer in the test group region.

According to some embodiments of the present disclosure, the method further includes patterning the conductive layer in the array region to form a second patterned conductive layer when patterning the first patterned conductive layer in the test group region.

According to some embodiments of the present disclosure, the first landing pads and the second patterned conductive layer are formed using a same method.

According to some embodiments of the present disclosure, the method further includes patterning the second patterned conductive layer to form a plurality of second landing pads on the precursor memory structure, in which the second landing pads are isolated from each other in the first direction and the second direction.

According to some embodiments of the present disclosure, each of the second landing pads has an island structure and overlaps a portion of the contact plug.

According to some embodiments of the present disclosure, the first landing pads are protected by a mask layer when forming the second landing pads.

According to some embodiments of the present disclosure, each of the first landing pads is overlapped with at least two contact plugs.

According to some embodiments of the present disclosure, the first landing pads constitute a serpentine pattern.

In accordance with another aspect of the present disclosure, a method of manufacturing a semiconductor structure is provided. The semiconductor structure includes a substrate, a plurality of transistors, an interlayer dielectric layer, a plurality of contact plugs and a plurality of first landing pads. The transistors are disposed in the substrate, in which each of the transistors includes a gate structure and source/drain regions disposed at two opposite sides of the gate structure. The interlayer dielectric layer is disposed on the substrate. The contact plugs are embedded in the interlayer dielectric layer, in which each of the contact plugs is electrically connected to one of the source/drain regions. The first landing pads are disposed on the interlayer dielectric layer and extending along a first direction, in which the first landing pads are separated from each other in a second direction that is different from the first direction and are electrically connected to each other through the contact plugs and the transistors.

According to some embodiments of the present disclosure, each of the first landing pads is overlapped with at least two contact plugs.

According to some embodiments of the present disclosure, each of the first landing pads electrically connects to the source/drain region through the contact plug.

According to some embodiments of the present disclosure, the first landing pads constitute a serpentine pattern.

According to some embodiments of the present disclosure, the first landing pads have different length.

According to some embodiments of the present disclosure, the first landing pads are connected to a power supply.

According to some embodiments of the present disclosure, the first landing pads have different width.

According to some embodiments of the present disclosure, the semiconductor further includes a plurality of bit line structures and a plurality of bit line contact plugs. The bit line structures are disposed over the substrate. The bit line contact plugs disposed between the substrate and the bit line structures, in which the bit line contact plugs electrically connect the bit line structures to the source/drain regions disposed between two contact plugs.

According to some embodiments of the present disclosure, the first landing pads overlap the bit line contact plugs.

In accordance with another aspect of the present disclosure, a method of testing a semiconductor structure is provided. The semiconductor is provided. A probe is then used to contact a conductive pad electrically connected to the first landing pads to determine whether a current flows through the semiconductor structure.

It is to be understood that both the foregoing general description and the following detailed description are by examples, and are intended to provide further explanation of the invention as claimed.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 3A, 4A, 5A, 6A, 7A, 8A, 9A, 10A and 11A are top views of various intermediary stages in the manufacturing of semiconductor structure in accordance with some embodiments of this disclosure.

FIGS. 3B, 4B, 5B, 6B, 7B, 8B, 9B, 10B and 11B are cross-sectional view of various intermediary stages in the manufacturing of semiconductor structure in accordance with some embodiments of this disclosure.

FIG. 12A is a top view of a semiconductor structure in a TEG region in accordance with some embodiments of this disclosure. FIG. 12B is a cross-sectional view taken along line A-A' of FIG. 12A.

FIGS. 15A-15D are enlarged diagrams of the semiconductor structure in FIG. 14.

DETAILED DESCRIPTION

Figures 1A, 1B:
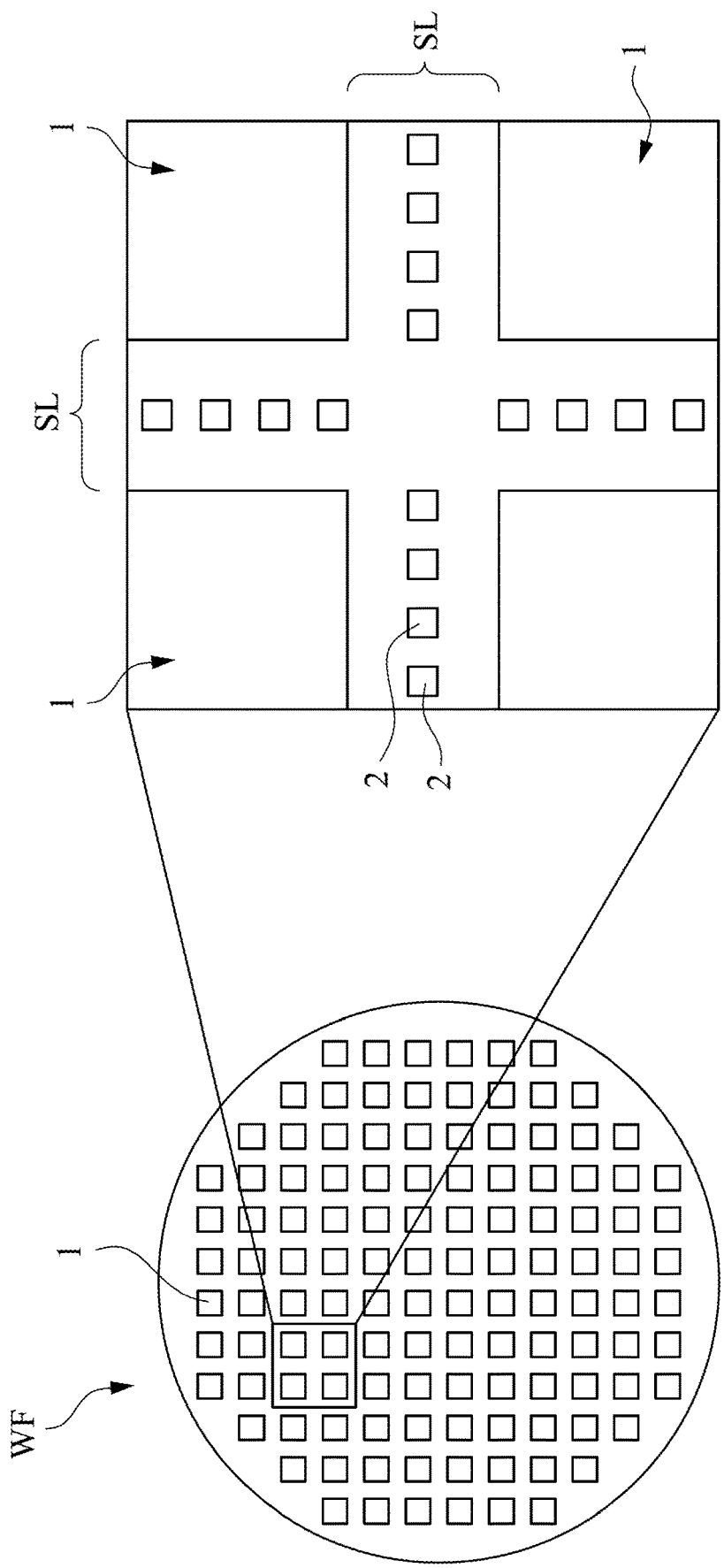
FIG. 1A is a top view of prior art illustrating a wafer including a plurality of chips.
FIG. 1B is a partial enlarged diagram of FIG. 1A.

In order to make the description of the present disclosure more detailed and complete, the following illustratively describes implementation aspects and specific embodiments of the present disclosure; however, this is not the only form in which the specific embodiments of the present disclosure are implemented or utilized. The embodiments disclosed below may be combined with or substituted by each other in an advantageous manner, and other embodiments may be added to an embodiment without further recording or description. In the following description, numerous specific details will be described in detail to enable readers to fully understand the following embodiments. However, the embodiments of the present disclosure may be practiced without these specific details.

Specific embodiments of the components and arrangements described below are intended to simplify the present disclosure. Of course, these are merely embodiments and are not intended to limit the present disclosure. For example, forming a first feature above or on a second feature in the subsequent description may include an embodiment in which the first feature and the second feature are formed as in direct contact, or include an embodiment in which an additional feature is formed between the first feature and the second feature such that the first feature and the second feature are not in direct contact. Additionally, component symbols and/or letters may be repeated in various embodiments of the present disclosure. This repetition is for the purpose of simplicity and clarity, and does not in itself indicate the relationship between the various embodiments and/or configurations discussed.

Furthermore, spatial relative terms, such as "below", "under", "above", "over", etc., are intended to facilitate description of the relative relationship between a component or feature and another component or feature, as shown in the drawings. The true meaning of these spatial relative terms includes other orientations. For example, when the illustration is flipped up and down by 180 degrees, the relationship between a component and another component may change from "below" or "under" to "above" or "over". Furthermore, the spatial relative narratives used herein should be interpreted the same.

Figure 2:
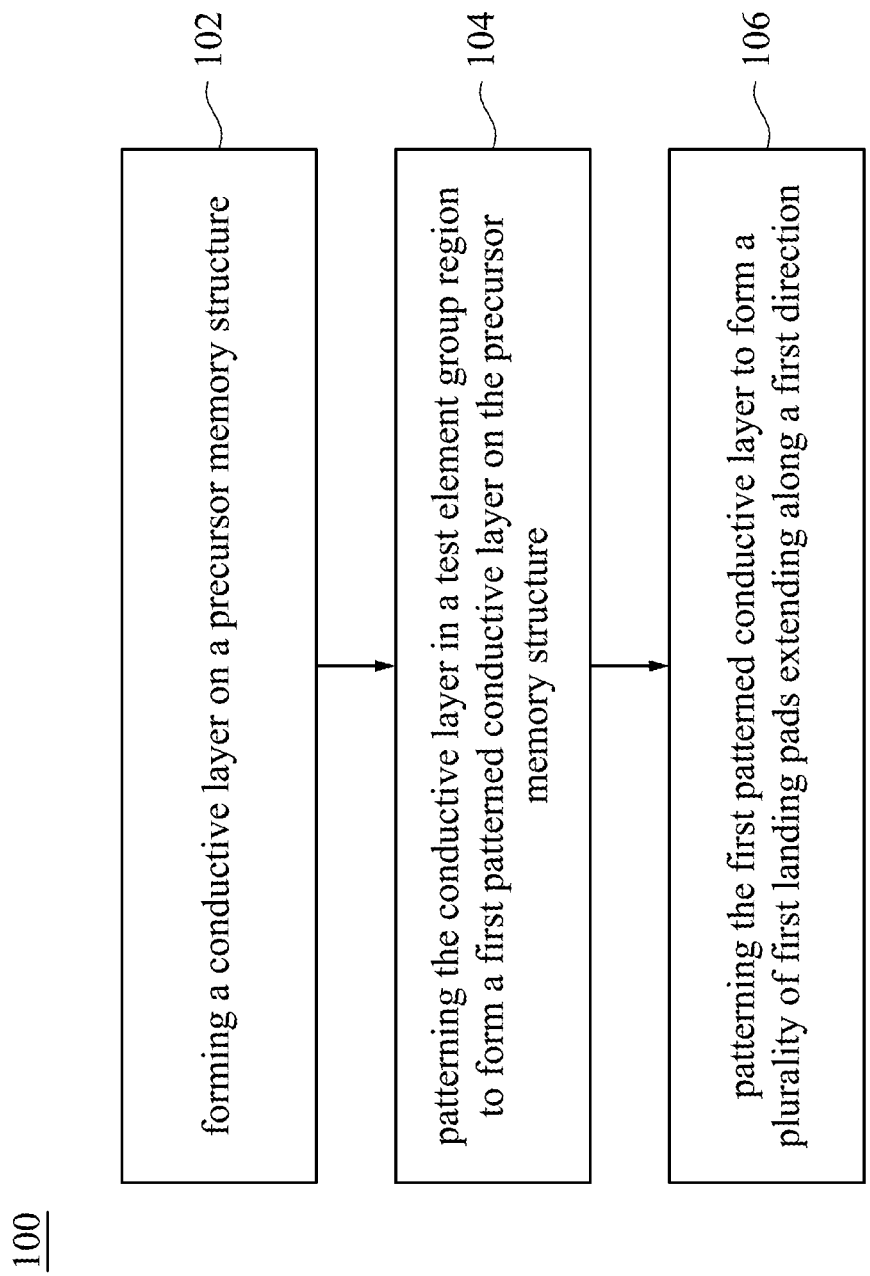
FIG. 2 is a flow chart illustrating a method of manufacturing a semiconductor structure in accordance with some embodiments of this disclosure.

FIG. 2 is a flow chart illustrating a method of manufacturing a semiconductor structure in accordance with some embodiments of this disclosure. As shown in FIG. 2, the method 100 includes operation 102, operation 104, and operation 106. The method for preparing the semiconductor structure 10 will be further described according to one or more embodiments below.

FIG. 3A is a top view of various intermediary stages in the manufacturing of semiconductor structure in accordance with some embodiments of this disclosure. FIG. 3B is a cross-sectional view taken along line A-A' of FIG. 3A. Reference is made to FIG. 2 and FIGS. 3A-3B. In the operation 102 of method 100, a conductive layer 250 is formed on a precursor memory structure 10a. The precursor memory structure 10a includes a plurality of transistors 210 disposed in a substrate 200 and a plurality of contact plugs 242 disposed in an interlayer dielectric (ILD) layer 240. It is noted that the ILD layer 240 and the conductive layer 250 are not shown in FIG. 3A for clarity.

In some embodiments, the substrate 200 includes a test element group (TEG) region 200a (shown in FIG. 4A), an array region 200b (shown in FIG. 6A) adjacent to the TEG region 200a and a peripheral region (not shown). In some embodiments, the substrate 200 includes silicon (Si), silicon-germanium (SiGe), silicon carbide (SiC), gallium (Ga), gallium nitride (GaN), gallium arsenide (GaAs), epitaxy layer, a combination thereof, or the like. A well region (not shown) may be formed in the substrate 200. The well region may be neutral, or may be an n-type or p-type doped region, depending on the conductivity type of the transistor structure formed thereafter. A shallow trench isolation (STI) structure 202 is formed in the substrate 200 for defining at least one active region 204.

As shown in FIG. 3B, at least one transistor 20a is disposed in the substrate 200 (e.g. in the array region 200b and the TEG region 200a). The transistor 20a includes a gate structure 210 and source/drain (S/D) regions 220a, 220b disposed at two opposite sides of the gate structure 210. In some embodiments, the gate structure 210 is a buried gate structure 210, but is not limited thereto. The gate structure 210 may include a gate electrode 214 and a gate dielectric layer 212 disposed between the substrate 200 and the gate electrode 214. An isolation structure 216 may be formed on the gate electrode 214. The buried gate structure 210 can serve as a buried word line (BWL) for a DRAM device, as shown in FIG. 3A. In some embodiments, the source/drain regions 220a, 220b include an n-type or a p-type doped region, depending on the conductivity type of the transistor structure to be formed. As shown in FIG. 3B, two gate structures 210 may share one S/D region 220a.

Still referring to FIG. 3B, the ILD layer 240 is formed on the substrate 200. In some embodiments, the ILD layer 240 can be a single-layered structure. In other embodiments, the ILD layer 240 can be a multi-layered structure. Contact plugs 242 are embedded in the ILD layer 240 and formed on the S/D regions 220b. Each of the contact plugs 242 is electrically connected to one of the source/drain regions 220b. A plurality of bit line structures 230 are further formed in the ILD layer 240. As shown in FIG. 3B, a bit line contact plug 232 is formed between the S/D region 220a and the bit line structure 230. The bit line contact plug 232 may electrically connect the bit line structure 230 to the S/D region 220a between two contact plugs 242. The substrate 200, the contact plugs 242 and the bit line structure 230 are covered by the ILD layer 240.

The conductive layer 250 covers the ILD layer 240 and the contact plugs 242. The conductive layer 250 is in contact with the contact plugs 242. In some embodiments, the conductive layer 250 includes conductive material, such as tungsten (W), aluminum (Al), titanium (Ti), titanium nitride (TiN), cobalt (Co), or the like.

Figure 4B:
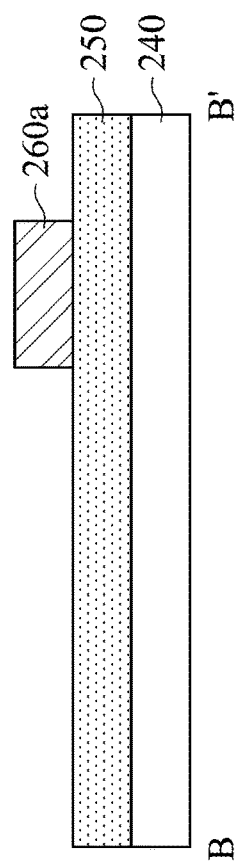
Figure 4A:
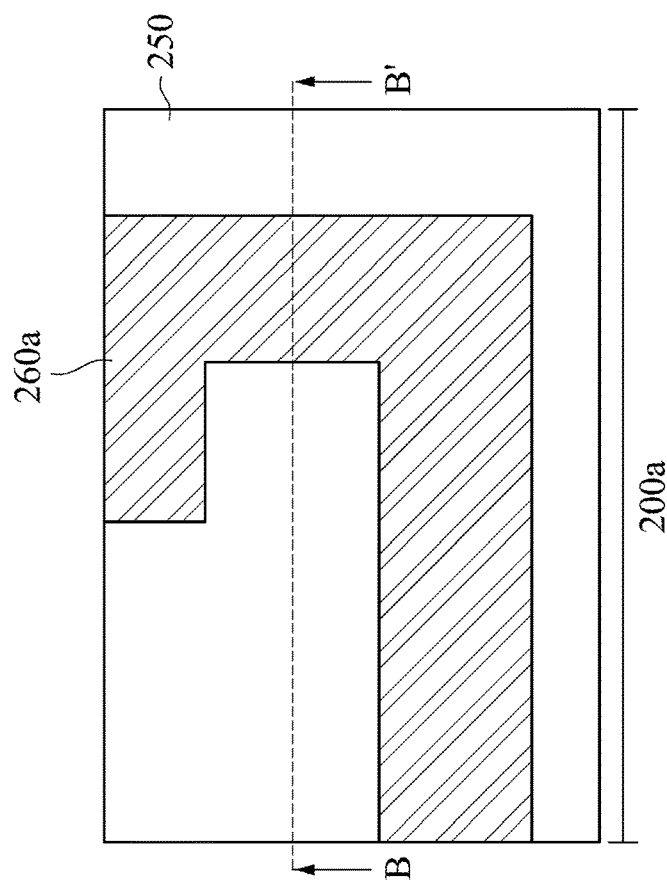
Figure 5B:
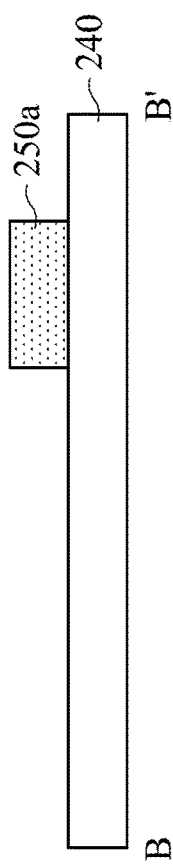
Figure 5A:
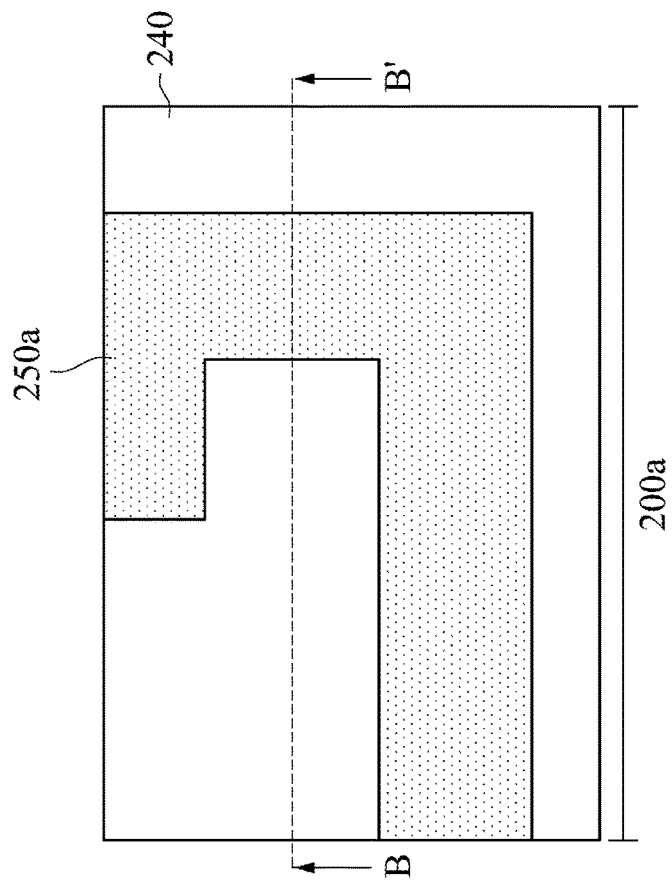

Reference is made to FIG. 2 and FIGS. 5A and 5B. In the operation 104 of method 100, the conductive layer 250 (shown in FIGS. 3A-3B) in the test element group region 200a is patterned to form a first patterned conductive layer 250a on the precursor memory structure 10a. FIGS. 4A-5B illustrate the detail steps of implementing operation 104 in accordance with an embodiment of the present disclosure. FIGS. 4A and 5A are top views illustrating a portion of the TEG region 200a in accordance with some embodiments of the present disclosure. FIGS. 4B and 5B are cross-sectional views taken along line B-B' of FIG. 4A and FIG. 5A.

Please refer to FIGS. 4A-4B, a mask 260a is formed on the conductive layer 250. It is noted that the ILD layer 240 shown in FIG. 4B is simplified for clarity. The mask 260a formed in the TEG region 200a may have a first pattern. As shown in FIGS. 4A and 4B, the mask 260a exposes a portion of the conductive layer 250 in the TEG region 200a. In some embodiments, the mask 260a may also be used to form conductive structures in the peripheral region (not shown). In some embodiments, the mask 260a can be a single-layered structure. In other embodiments, the mask 260a can be a multi-layered structure.

Please refer to FIGS. 5A-5B, the conductive layer 250 exposed by the mask 260a (shown in FIG. 4A and FIG. 4B) is then removed. As such, the first patterned conductive layer 250a is formed. In some embodiment, the first patterned conductive layer 250a has a first pattern exposing a portion of a top surface of the ILD layer 240. After the formation of the first patterned conductive layer 250a, the mask 260a is then removed.

FIGS. 6A and 7A are top views illustrating a portion of the array region 200b in accordance with some embodiments of the present disclosure. FIGS. 6B and 7B are cross-sectional views taken along line C-C' of FIG. 6A and FIG. 7A. Please refer to FIGS. 6A-6B, the conductive layer 250 in the array region 200b is protected by a mask 260b when patterning the conductive layer 250 in the test element group region 200a. That is, the operation 104 of method 100 may be performed in a state where the array region 200b is protected by the mask 260b. As shown in FIGS. 6A-6B, the mask 260b is formed on the ILD layer 240 and completely covers a top surface of the conductive layer 250 in the array region 200b. In some embodiments, the mask 260b can be a single-layered structure. In other embodiments, the mask 260b can be a multi-layered structure. In some embodiments, the mask 260b may have a material that is same as that of the mask 260a. As shown in FIGS. 7A and 7B, the mask 260b is then removed when removing the mask 260a.

Reference is made to FIG. 2 and FIGS. 8A-8B. In the operation 106 of method 100, the first patterned conductive layer 250a (shown in FIGS. 5A-5B) is patterned to form a plurality of first landing pads 252a extending along the first direction D1. In some embodiments, the first patterned conductive layer 250a having the first pattern is cut by a plurality of first trenches T1 extending along the first direction D1. In some embodiments, the first trenches T1 have same width. In other embodiments, one first trench T1 has a width different from the adjacent first trenches T1. The first trenches T1 may expose a portion of the top surface of the ILD layer 240. In some embodiments, each of the first landing pads 252a has a strip structure. As shown in FIG. 8A, the first landing pads 252a are separated from each other in a second direction D2 that is different from the first direction D1. In some embodiments, the first landing pads 252a have different length (e.g. length L1 and length L2) extending along the first direction, as shown in FIG. 8A. The first landing pads 252a have a width W1 in the second direction D2. In some embodiments, each of the first landing pads 252a has same width W1. In other embodiments, one first landing pad 252a has a width that is different from that of the adjacent first landing pads 252a.

In some embodiments, the first landing pads 252a can be formed by any suitable method. For example, the first landing pads 252a may be patterned using one or more photolithography processes, including double-patterning or multi-patterning processes. In some embodiments, a sacrificial layer (not shown) may be formed to cover the ILD layer 240 and the first patterned conductive layer 250a. The sacrificial layer is then patterned through a patterned photoresist layer (not shown). Spacers (not shown) are then formed on opposite sidewalls of the patterned sacrificial layer. The patterned sacrificial layer is then removed, and the remaining spacers may then be used to pattern the first patterned conductive layer 250a.

Please refer to FIGS. 9A and 9B, the conductive layer 250 (shown in FIGS. 7A-7B) in the array region 200b is patterned to form a second patterned conductive layer 250b when patterning the first patterned conductive layer 250a in the test element group region 200a. In some embodiments, the conductive layer 250 in the array region 200a is cut by a plurality of first trenches T1 extending along the first direction D1. The first trenches T1 may expose a portion of the top surface of the ILD layer 240. In some embodiments, the first trenches T1 have same width. In other embodiments, one the first trench T1 has a width different from the adjacent first trenches T1. In some embodiments, the second patterned conductive layer 250b includes a plurality of conductive strips extending along the first direction D1 and separating from each other in the second direction D2. The conductive strips may have a width W2 in the second direction D2. In some embodiments, each of the conductive strips has same width W2. In other embodiments, one conductive strip has a width that is different from that of the adjacent conductive strip.

In some embodiments, the second patterned conductive layer 250b can be formed by any suitable method. For example, the second patterned conductive layer 250b may be patterned using one or more photolithography processes, including double-patterning or multi-patterning processes. In some embodiments, the second patterned conductive layer 250b is formed using a method same as that of the first landing pads 252a. In some embodiments, the second patterned conductive layer 250b is formed by using a mask (e.g. spacers) that is same as that of the first landing pads 252a. Accordingly, in some embodiments, the width W2 of the second patterned conductive layer 250b is same as the width W1 of the first landing pads 252a.

Figure 10B:
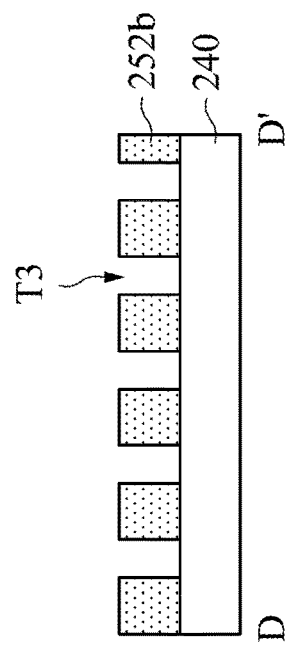
Figure 10A:
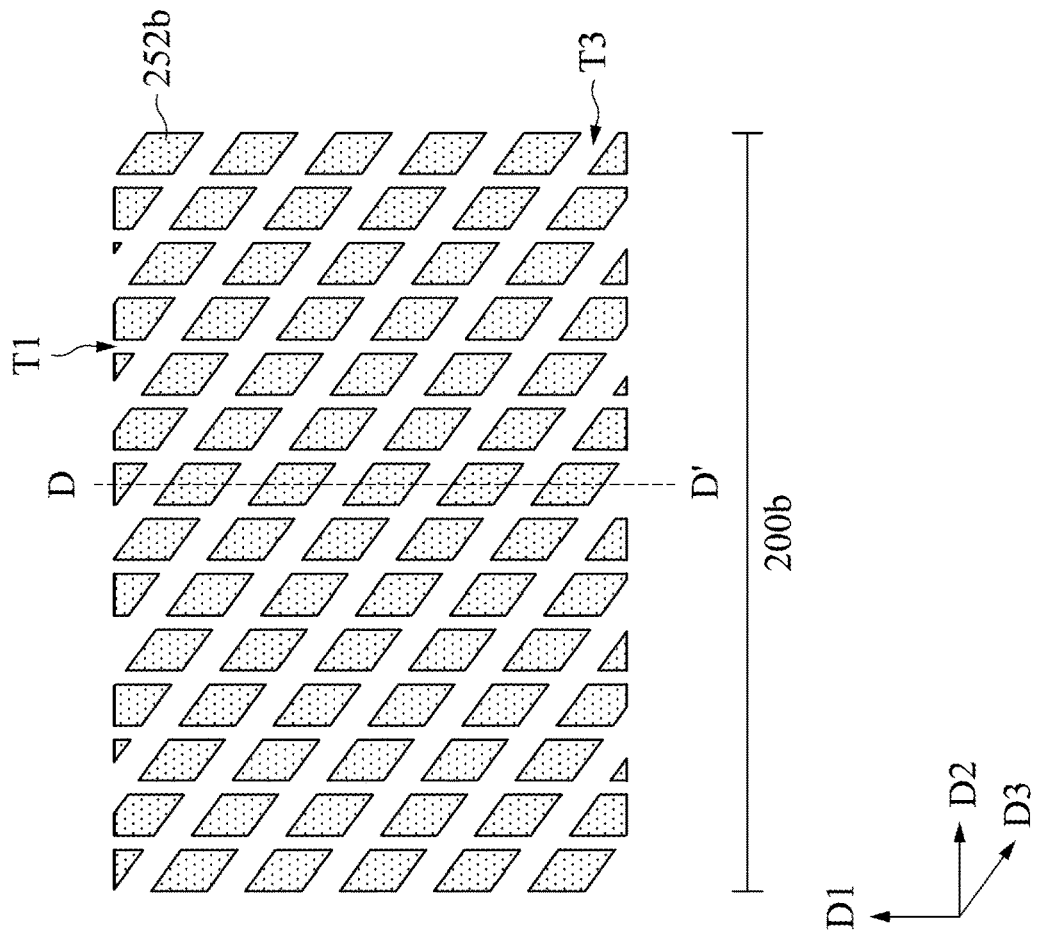

In some embodiments, the method 100 of FIG. 2 further includes other operations. Please refer to FIGS. 10A and 10B, the second patterned conductive layer 250b (shown in FIGS. 9A and 9B) in the array region 200b is patterned to form a plurality of second landing pads 252b on the ILD layer 240. In some embodiments, the second patterned conductive layer 250b is cut by a plurality of second trenches T2 extending along the third direction D3. The second trenches T2 may expose a portion of the top surface of the ILD layer 240. In some embodiments, the second trenches T2 have same width. In other embodiments, one second trenches T2 has a width different from the adjacent second trenches T2. In some embodiments, the width of the first trenches T1 is same as that of the second trenches T2. In other embodiments, the width of the first trenches T1 is different from that of the second trenches T2. In some embodiments, each of the second landing pads 252b has an island structure. In some embodiments, the second landing pads 252b are isolated from each other in the first direction D1 and the second direction D2. In some embodiments, each of the second landing pads 252b has same size.

In some embodiments, the second landing pads 252b can be formed by any suitable method. For example, the landing pads may be patterned using one or more photolithography processes, including double-patterning or multi-patterning processes. In some embodiments, the second landing pads 252b is formed using a method same as that of the second patterned conductive layer 250b.

Figure 11B:
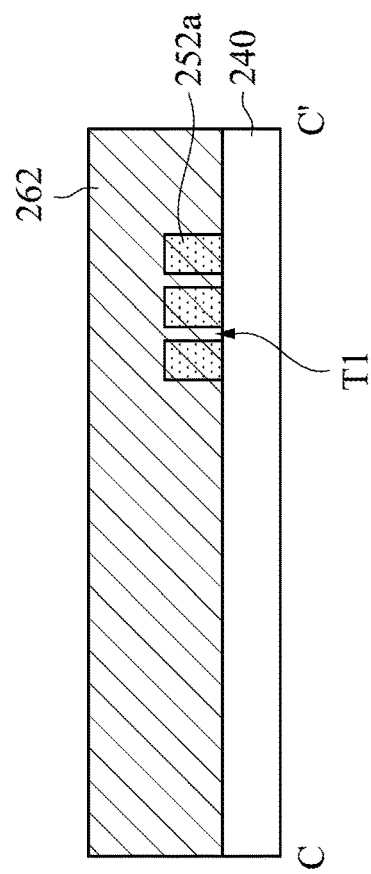
Figure 11A:
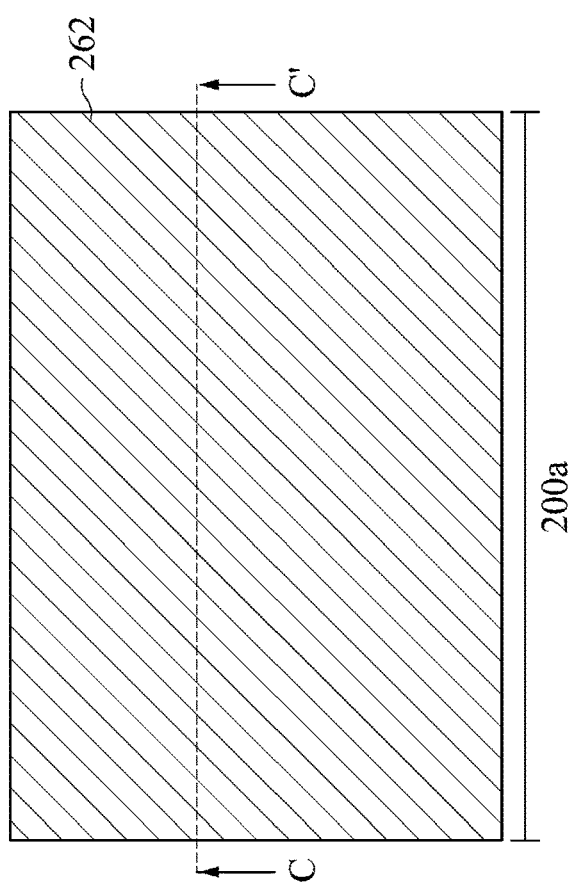

Please refer to FIGS. 11A and 11B, the first landing pads 252a in the TEG region 200a are protected by a mask layer 262 when forming the second landing pads 252b. That is, the second landing pads 252b may be formed in a state where the TEG region 200a is protected by the mask layer 262. The mask layer 262 is formed on the ILD layer 240 in the TEG region 200a. The mask layer 262 completely covers the first landing pads 252a and a top surface of the ILD layer 240. The mask layer 262 is formed to fill the trenches T1 between the adjacent first landing pads 252a. In some embodiments, the mask layer can be a single-layered structure. In other embodiments, the mask layer can be a multi-layered structure. The mask layer 262 is then removed after the second landing pads (shown in FIGS. 10A-10B) in the array region 200b are formed.

Reference is made to FIGS. 12A-12B. FIG. 12A is a top view of a semiconductor structure in the TEG region 200a in accordance with some embodiment of this disclosure. FIG. 12B is a cross-sectional view taken along line A-A' of FIG. 12A. In the TEG region 200a, the semiconductor structure 30a includes a substrate 200, an interlayer dielectric layer 240, a plurality of contact plugs 242, and a plurality of first landing pads 252a. A plurality of transistors 210 are disposed in the substrate 200. Each of the transistors 210 includes a gate structure 210 and source/drain regions 220a, 220b disposed at two opposite sides of the gate structure 210. The interlayer dielectric layer 240 is disposed on the substrate 200. A plurality of contact plugs 242 are embedded in the interlayer dielectric layer 240. Each of the contact plugs 242 is electrically connected to one of the source/drain regions 220a, 220b. A plurality of first landing pads 252a are disposed on the interlayer dielectric layer 240 and extend along the first direction D1.

As shown in FIG. 12A, the first landing pads 252a are separated from each other in a second direction D2 that is different from the first direction D1. The first landing pads 252a are physically separated from each other, as shown in FIG. 12A. However, the first landing pads 252a are electrically connected to each other through the contact plugs 242 and the transistors 210. Specifically, as shown in FIG. 12B, each of the first landing pads 252a is electrically connected to the source/drain regions 220b through the contact plug 242. For example, the first landing pad 252a on the left of FIG. 12B is electrically connected to one source/drain region 220b through the contact plug 242 on the left of FIG. 12B, and another first landing pad 252a on the right of FIG. 12B is electrically connected to another source/drain region 220b through the contact plug 242 through the contact plug 242 on the right of FIG. 12B. Accordingly, the first landing pads 252a are electrically connected to the transistor 20a disposed in the substrate 200.

In some embodiments, the first landing pads 252a have a strip structure. The first landing pads 252a may have different length. For example, a portion of the first landing pads 252a have a length greater than that of the other first landing pads 252a, as shown in FIG. 12A. The first landing pads 252a may have same width. In other embodiments, one first landing pad 252a has a width different from the adjacent one. In some embodiments, each of the first landing pads 252a is overlapped with at least two contact plugs 242. In some embodiments, each of the first landing pads 252a is electrically connected to at least two contact plugs 242. In some embodiments, a portion of the contact plugs 242 is not overlapped with the first landing pads 252a.

In some embodiments, a plurality of bit line structures 230 are disposed over the substrate 200. A bit line contact plug 232 may be disposed between the substrate 200 and each of the bit line structures 230. The bit line contact plugs 232 electrically connect the bit line structures 230 to the source/drain regions 220a disposed between two contact plugs 242. In some embodiments, the first landing pads 252a overlap the bit line contact plugs 232. The first landing pads 252a are physically and electrically isolated from the bit line structures 230 by the ILD layer 240.

Figure 13B:
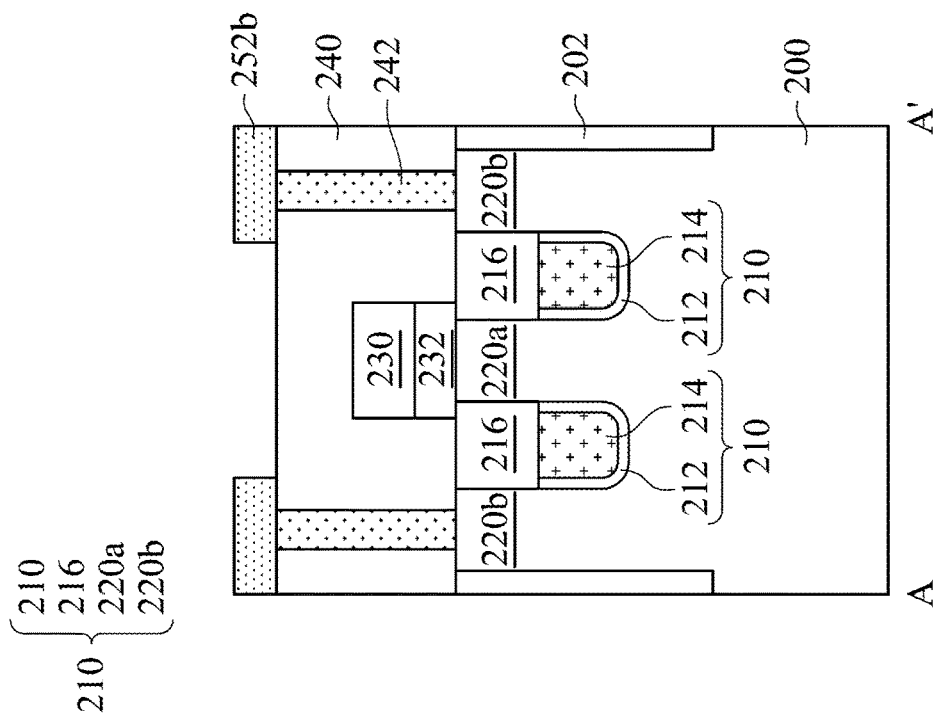
FIG. 13B is a cross-sectional view taken along line A-A' of FIG. 13A.
Figure 13A:
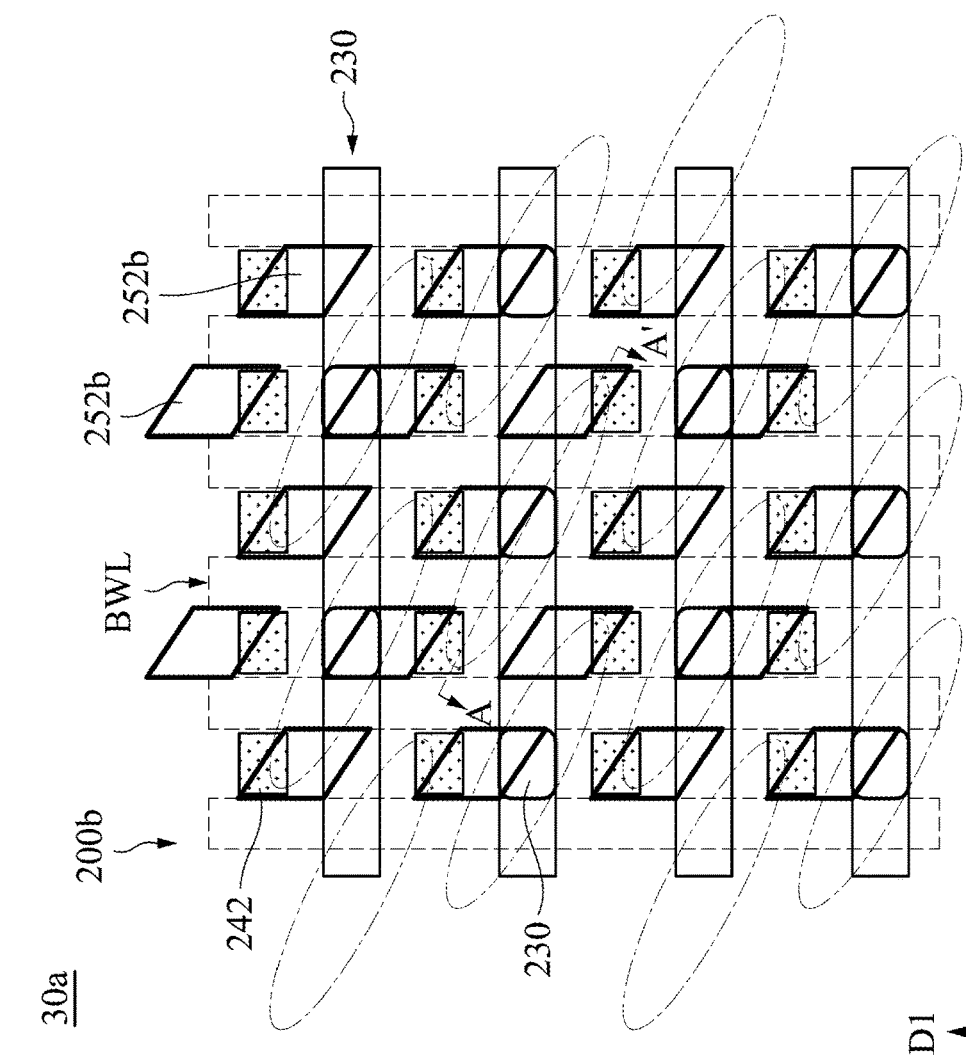
FIG. 13A is a top view of a semiconductor structure in an array region in accordance with some embodiments of this disclosure.

Reference is made to FIGS. 13A-13B. FIG. 13A is a top view of a semiconductor structure in the array region 200b in accordance with some embodiment of this disclosure. FIG. 13B is a cross-sectional view taken along line A-A' of FIG. 13A. The semiconductor structure 30a further includes an array region 200b. The semiconductor structure 30a in the array region 200b may have a structure similar to the TEG region 200a. Specifically, the semiconductor structure 30a in the array region 200b includes a substrate 200, an interlayer dielectric layer 240, a plurality of contact plugs 242 and a plurality of second landing pads 252b.

As shown in FIGS. 13A-13B, the second landing pads 252b formed on the ILD layer 240 are separated from each other in the first direction D1 and the second direction D2. In some embodiments, the second landing pads 252b have an island pattern. In some embodiments, each of the second landing pads 252b is overlapped with one contact plug 242. For example, the second landing pad 252b may be overlapped with a portion of the contact plug 242. Accordingly, each of the second landing pads 252b is electrically connected the source/drain regions 220b through the contact plug 242. A portion of the second landing pads 252b may be overlapped with the bit line structures 230. However, the second landing pads 252b are isolated from the bit line structures 230. In some embodiments, a capacitor (not shown) can be disposed over each of the second landing pads 252b. The capacitor can be electrically connected to S/D regions 220b through the second landing pad 252b and the contact plug 242. Consequently, a DRAM cell including MOSFET device and capacitor is obtained.

Figure 14:
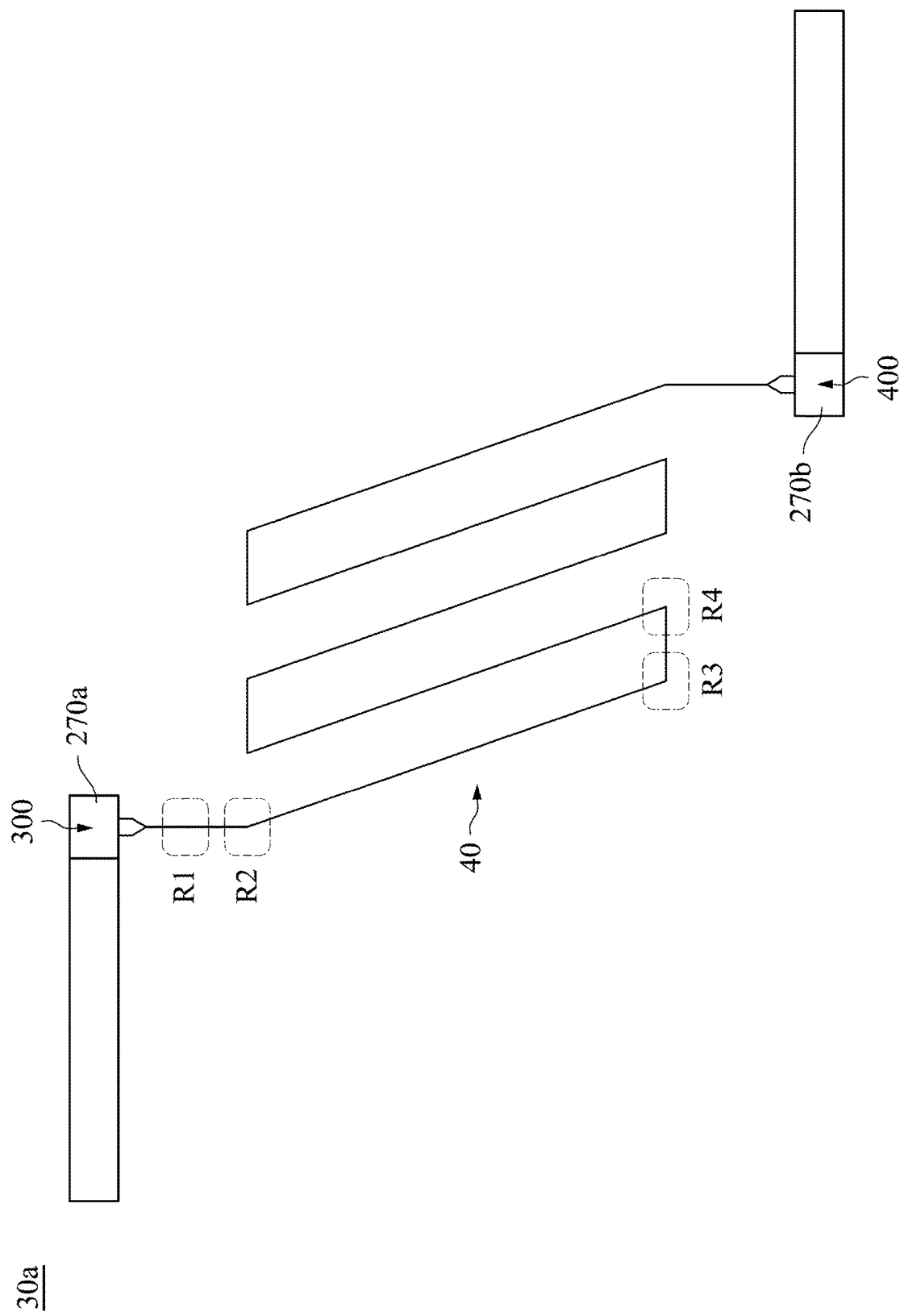
FIG. 14 is a top view of a semiconductor structure in a TEG region in accordance with some embodiments of this disclosure.

Reference is made to FIG. 14 and FIGS. 15A-15D. FIG. 14 is a top view a semiconductor structure in a TEG region in accordance with some embodiments of this disclosure. FIGS. 15A, 15B, 15C and 15D are partial enlarged diagrams of a region surrounded by a dotted line R1, R2, R3 and R4 shown in FIG. 14. Reference is made to FIG. 14. The first landing pads 252a shown in FIGS. 15A-15D may constitute a conductive structure 40, as illustrate in FIG. 14. In some embodiments, the conductive structure 40 has a serpentine pattern. In some embodiments, the first landing pads are connected to conductive pads 270a and 270b. In some embodiments, the conductive pads 270a and 270b can be connected to an external circuit for testing the semiconductor structure 30a. Since the structure in the TEG region 200a (shown in FIG. 12B) is similar to that of the array region 200b (shown in FIG. 13B), a testing process is applied to confirm the electrical property of the DRAM cells. For example, when testing the semiconductor structure 30a, a voltage 300 may be applied to the conductive pad 270a, and a probe 400 may be used to contact the conductive pad 270b to detect whether a current flows through the conductive structure 40. If a current flows through the conductive structure 40, the semiconductor structure 30a is deemed properly formed. If there is no current flowing through the conductive structure 40, the semiconductor structure 30a is deemed defective.

Figure 15D:
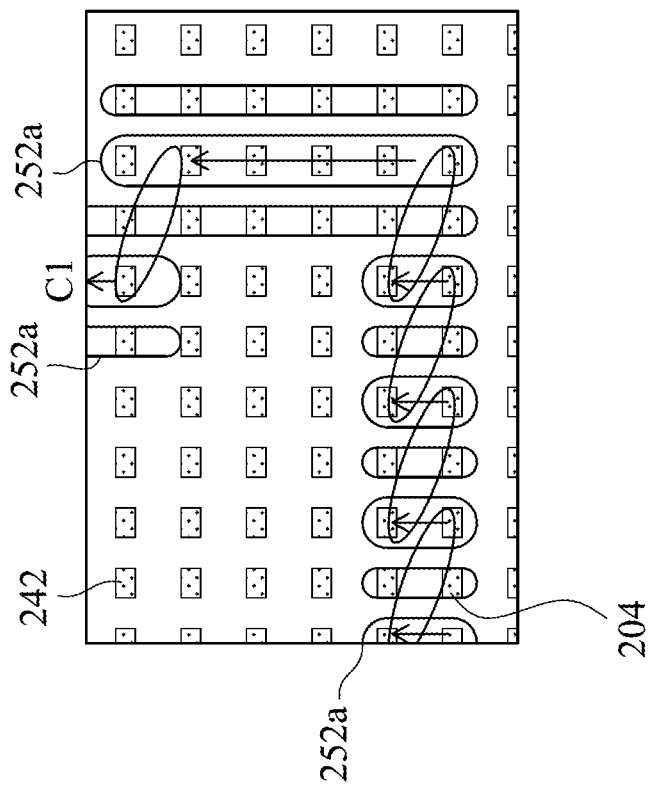
Figure 15C:
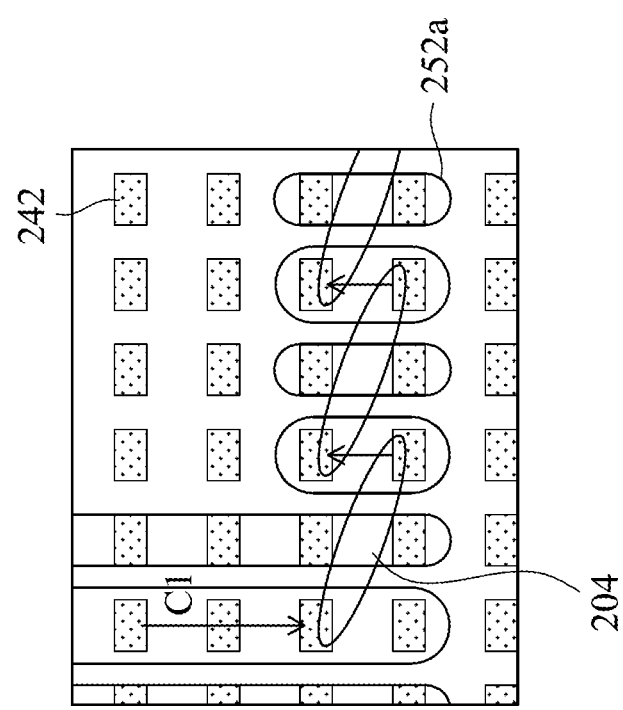

Please refer to in FIGS. 15A-15D, a current Cl (represented by an arrow) may flow through the separated first landing pads 252a via transistors 210 (shown in FIG. 12B) disposed in the active region 204. As shown in FIG. 15B, the current Cl may flow through one first landing pad 252a, the contact plug 242a, the transistor 210 (shown in FIG. 12B) connected to the contact plug 242a, the contact plug 242b and another first landing pads 252a.

As described above, according to the embodiments of the present disclosure, a semiconductor structure and a method of manufacturing thereof are provided. The semiconductor structure includes a test element group (TEG) region and an array region. In the TEG region, a plurality of transistors is disposed in a substrate, an interlayer dielectric (ILD) layer is disposed on the substrate, a plurality of contact plugs are embedded in the ILD layer and a plurality of first landing pads are disposed on the ILD layer. The first landing pads can be connected to an external circuit for testing. The structure in the array region is similar to that of the TEG region, in which a plurality of second landing pads are disposed on the ILD layer.

In the manufacturing of the semiconductor structure, the first landing pads may formed through two patterning process. For example, the first landing pads are formed by using a first mask for patterning a peripheral circuit and a second mask for pattering an array circuit. Therefore, the first landing pads can align with the underlying contact plug and an overlap shift issue can be prevented.

Although the present invention has been described in considerable detail with reference to certain embodiments thereof, other embodiments are possible. Therefore, the spirit and scope of the appended claims should not be limited to the description of the embodiments contained herein.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims.

What is claimed is:

1. A method of manufacturing a semiconductor structure, comprising:
   forming a conductive layer on a precursor memory structure, wherein the precursor memory structure comprises:
      a plurality of transistors disposed in a substrate, wherein each of the transistors comprises a gate structure and source/drain regions disposed at two opposite sides of the gate structure; and
      a plurality of contact plugs disposed on and connected to the transistors;
   patterning the conductive layer in a test element group region to form a first patterned conductive layer on the precursor memory structure;
   patterning the first patterned conductive layer to form a plurality of first landing pads extending along a first direction, wherein the first landing pads are separated from each other in a second direction that is different from the first direction and are electrically connected to each other through the contact plugs and the transistors:
   forming a plurality of bit line structures disposed over the substrate; and
   forming a plurality of bit line contact plugs disposed between the substrate and the bit line structures, wherein the bit line contact plugs electrically connect the bit line structures to the source/drain regions disposed between two contact plugs.

2. The method of claim 1, wherein each the first landing pads is overlapped with at least two contact plugs.

3. The method of claim 1, wherein the first landing pads constitute a serpentine pattern.

4. The method of claim 1, wherein the precursor memory structure comprises an array region adjacent to the test element group region.

5. The method of claim 4, wherein the conductive layer in the array region is protected by a mask layer when patterning the conductive layer in the test element group region.

6. The method of claim 4, further comprising patterning the conductive layer in the array region to form a second patterned conductive layer when patterning the first patterned conductive layer in the test element group region.

7. The method of claim 6, wherein the first landing pads and the second patterned conductive layer are formed using a same method.

8. The method of claim 6, further comprising patterning the second patterned conductive layer to form a plurality of second landing pads on the precursor memory structure, wherein the second landing pads are isolated from each other in the first direction and the second direction.

9. The method of claim 8, wherein each of the second landing pads has an island structure and overlaps a portion of the contact plug.

10. The method of claim 8, wherein the first landing pads are protected by a mask layer when forming the second landing pads.

11. A semiconductor structure, comprising:
a plurality of transistors disposed in a substrate, wherein each of the transistors comprises a gate structure and source/drain regions disposed at two opposite sides of the gate structure;
an interlayer dielectric layer disposed on the substrate;
a plurality of contact plugs embedded in the interlayer dielectric layer, wherein each of the contact plugs is electrically connected to one of the source/drain regions;
a plurality of first landing pads disposed on the interlayer dielectric layer and extending along a first direction, wherein the first landing pads are separated from each other in a second direction that is different from the first direction and are electrically connected to each other through the contact plugs and the transistors;
a plurality of bit line structures disposed over the substrate; and
a plurality of bit line contact plugs disposed between the substrate and the bit line structures, wherein the bit line contact plugs electrically connect the bit line structures to the source/drain regions disposed between two contact plugs.

12. The semiconductor structure of claim 11, wherein each of the first landing pads is overlapped with at least two contact plugs.

13. The semiconductor structure of claim 11, wherein each of the first landing pads electrically connects to the source/drain region through the contact plug.

14. The semiconductor structure of claim 11, wherein the first landing pads constitute a serpentine pattern.

15. The semiconductor structure of claim 11, wherein the first landing pads have different lengths.

16. The semiconductor structure of claim 11, wherein the first landing pads are connected to a power supply.

17. The semiconductor structure of claim 11, wherein the first landing pads have different widths.

18. The semiconductor structure of claim 11, the first landing pads overlap the bit line contact plugs.

19. A method of testing a semiconductor structure, comprising:
providing the semiconductor structure of claim 11; and
using a probe to contact a conductive pad electrically connected to the first landing pads to determine whether a current flows through the semiconductor structure.

* * * * *